(12) United States Patent
Lin

(10) Patent No.: US 7,582,953 B2
(45) Date of Patent: Sep. 1, 2009

(54) PACKAGE STRUCTURE WITH LEADFRAME ON OFFSET CHIP-STACKED STRUCTURE

(75) Inventor: Hung Tsun Lin, Hsinchu (TW)

(73) Assignees: Chipmos Technologies Inc., Hsinchu (TW); Chipmos Technologies (Bermuda) Ltd., Hamilton (BM)

( * ) Notice: Subject to any disclaimer, the term of this patent is extended or adjusted under 35 U.S.C. 154(b) by 46 days.

(21) Appl. No.: 11/882,820

(22) Filed: Aug. 6, 2007

(65) Prior Publication Data
US 2008/0036067 A1 Feb. 14, 2008

(30) Foreign Application Priority Data
Aug. 7, 2006 (TW) .............. 95128831 A

(51) Int. Cl.
*H01L 23/48* (2006.01)

(52) U.S. Cl. .................... 257/666; 257/676

(58) Field of Classification Search ........... 257/672, 257/735, 777, 666, 676, E23.066
See application file for complete search history.

(56) References Cited

U.S. PATENT DOCUMENTS

| | | | |
|---|---|---|---|
| 5,373,189 A | 12/1994 | Massit et al. | |
| 5,473,196 A | 12/1995 | De Givry | |
| 5,998,864 A | 12/1999 | Khandros et al. | |
| 6,133,626 A | 10/2000 | Hawke et al. | |
| 6,215,182 B1 * | 4/2001 | Ozawa et al. | 257/723 |
| 6,261,865 B1 | 7/2001 | Akram | |
| 6,307,257 B1 * | 10/2001 | Huang et al. | 257/676 |
| 6,376,904 B1 | 4/2002 | Haba et al. | |
| 6,461,897 B2 | 10/2002 | Lin et al. | |
| 6,514,794 B2 | 2/2003 | Haba et al. | |
| 6,605,875 B2 | 8/2003 | Eskildsen | |
| 6,621,155 B1 | 9/2003 | Perino et al. | |
| 6,650,008 B2 | 11/2003 | Tsai et al. | |
| 6,759,307 B1 | 7/2004 | Yang | |
| 6,843,421 B2 | 1/2005 | Chhor et al. | |
| 6,900,528 B2 | 5/2005 | Mess et al. | |
| 6,949,835 B2 | 9/2005 | Konishi et al. | |
| 7,015,586 B2 | 3/2006 | Chien | |
| 7,095,104 B2 | 8/2006 | Blackshear | |
| 7,145,247 B2 | 12/2006 | Kawano et al. | |
| 7,170,160 B1 * | 1/2007 | Wang | 257/686 |
| 2001/0031513 A1 * | 10/2001 | Masuda et al. | 438/107 |
| 2006/0226529 A1 * | 10/2006 | Kato et al. | 257/686 |
| 2006/0267173 A1 * | 11/2006 | Takiar et al. | 257/686 |
| 2008/0017955 A1 * | 1/2008 | Do et al. | 257/659 |

\* cited by examiner

*Primary Examiner*—Thao Le
(74) *Attorney, Agent, or Firm*—Ming Chow; Sinorica, LLC

(57) ABSTRACT

The present invention provides a package structure with lead-frame on stacked chips, comprising: a lead-frame, composed of a plurality of outer leads arranged in rows facing each other and a plurality of inner leads arranged in rows facing each other formed by a plurality of wires, wherein the plurality of inner leads are divided into first inner leads and second inner leads, and the length of the first inner leads is greater than that of the second inner leads; and a plurality of semiconductor chip devices. The active surface of each chip faces upward and chips are misaligned to form offset stacked structure, wherein the semiconductor chip device stacked uppermost is fixedly connected under said first inner leads, and the plurality of semiconductor chip devices are electrically connected to the first inner leads and the second inner leads on the same side edge.

20 Claims, 9 Drawing Sheets

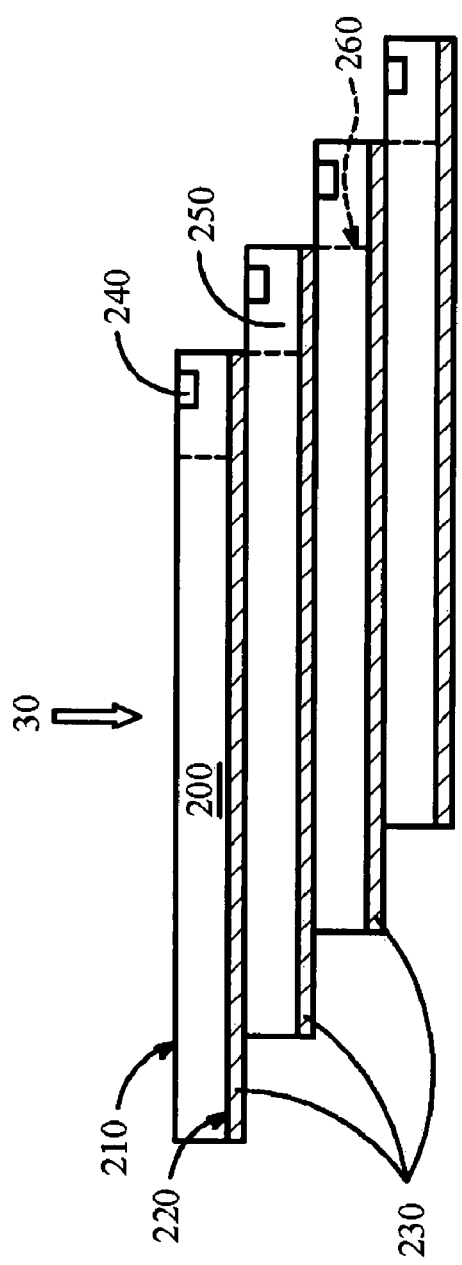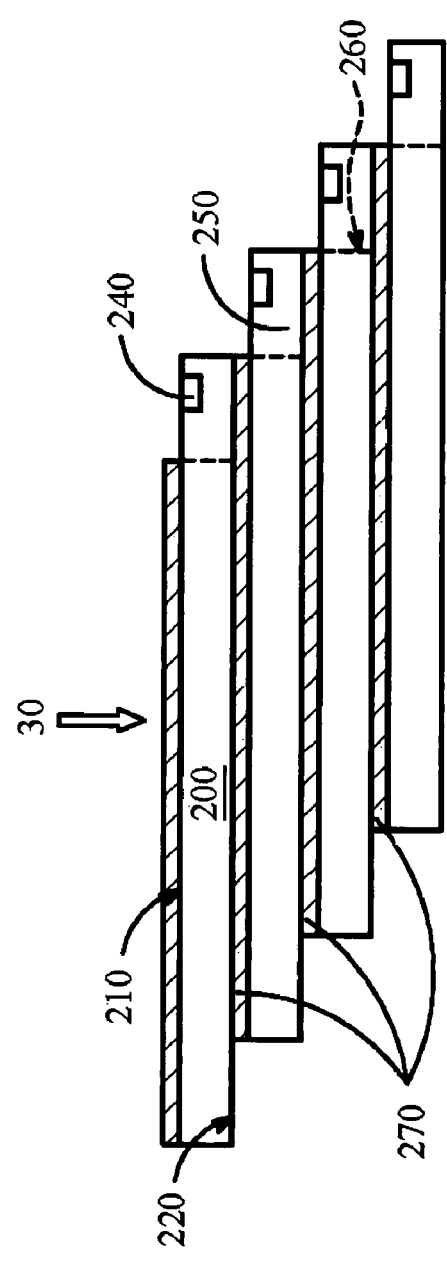

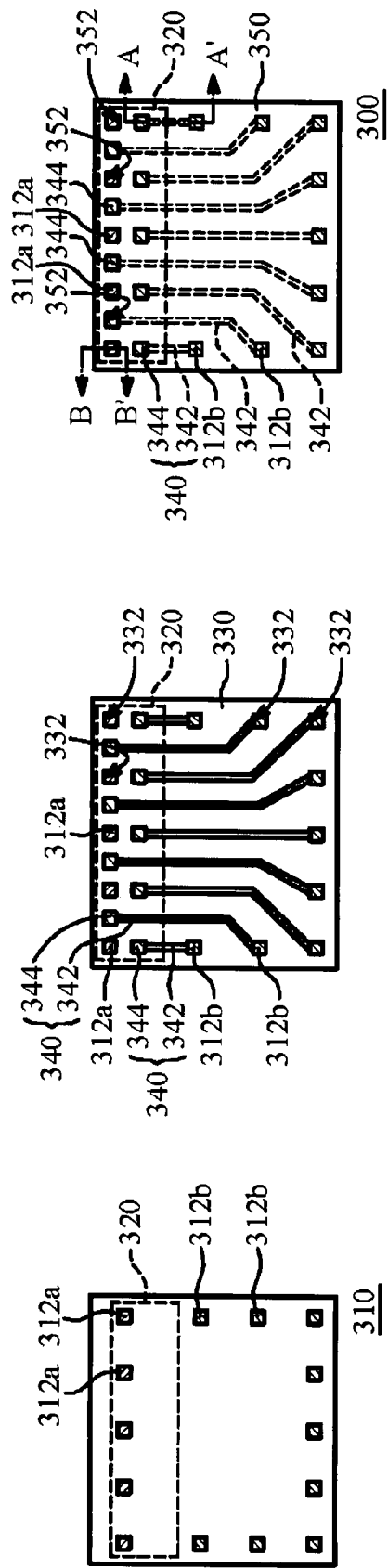

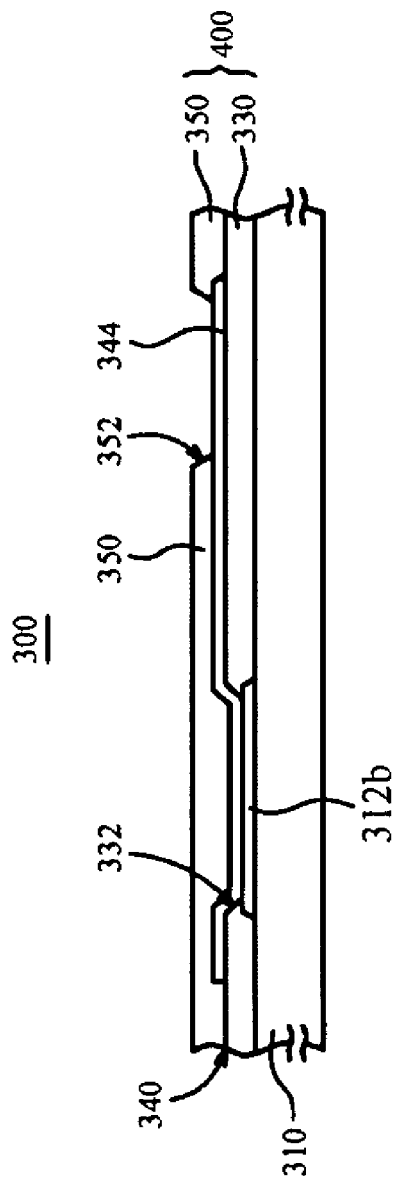
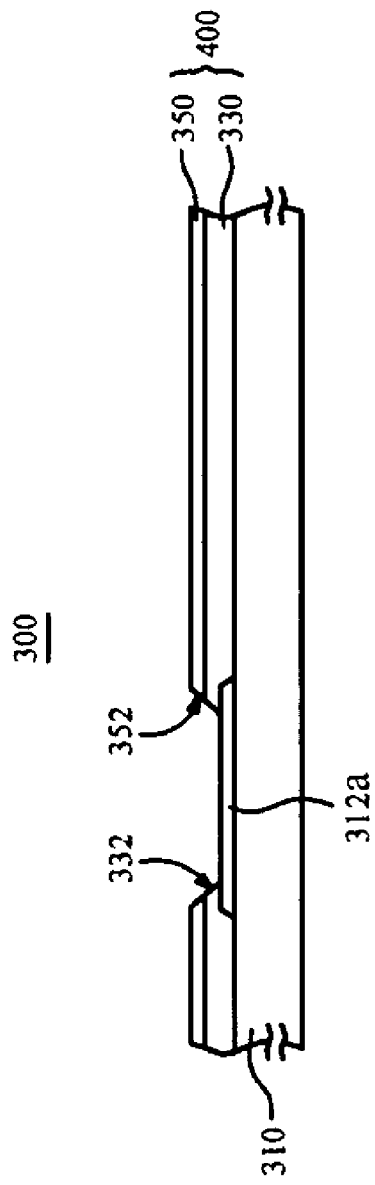
FIG. 4A
FIG. 4B

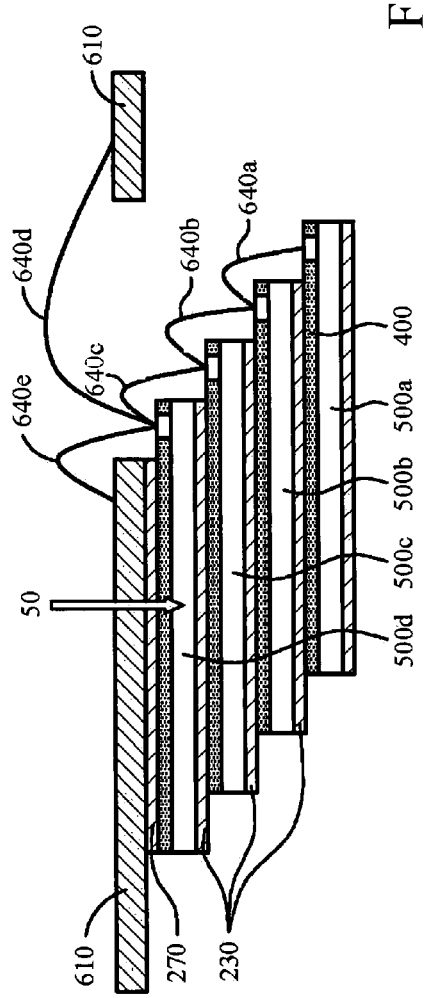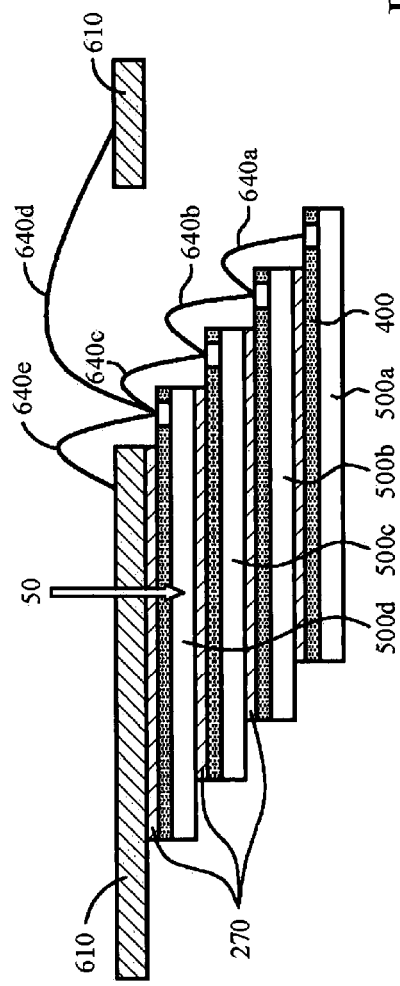

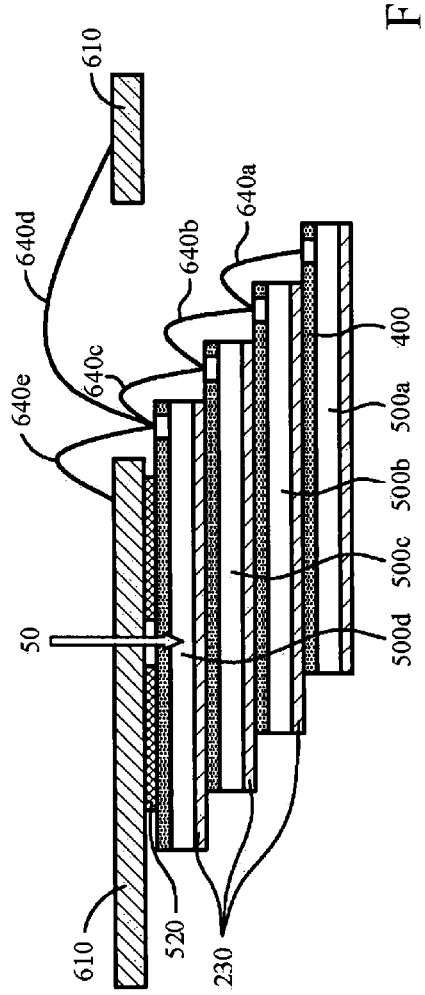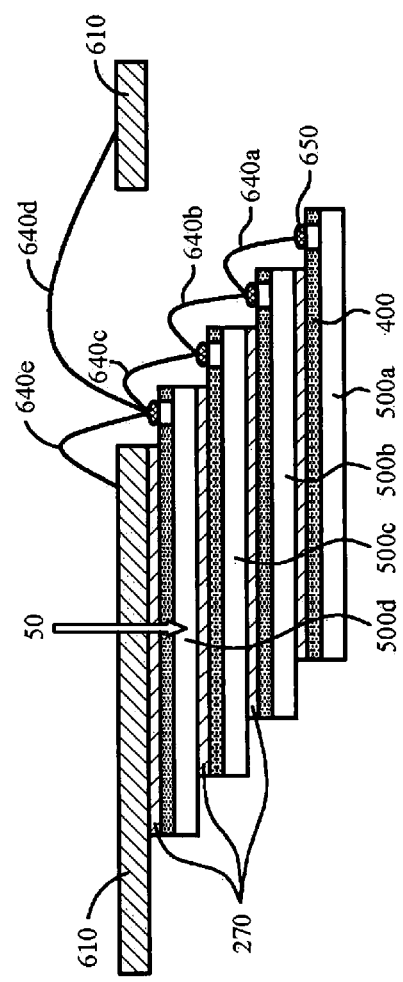

PACKAGE STRUCTURE WITH LEADFRAME ON OFFSET CHIP-STACKED STRUCTURE

BACKGROUND OF THE INVENTION

1. Field of the Invention

The present invention relates to a chip-stacked package structure, and more particularly, to form a chip-stacked package structure with lead-frame.

2. Description of the Prior Art

In semiconductor post-processing, many efforts have been made for increasing scale of the integrated circuits such as memories while minimizing the occupied area. Accordingly, the development of three-dimensional (3D) packaging technology is in progress and the idea of making up a chip-stacked structure has been disclosed.

The prior art has taught that a chip-stacked structure can be formed by firstly stacking a plurality of chips and then electrically connecting the chips to the substrate in wire bonding process. FIG. 1 shows a chip-stacked package structure that using lead-frame as a substrate, wherein FIG. 1A is a cross-sectional view and FIG. 1B is a plane view of FIG. 1A. As shown in FIG. 1A, lead-frame 5 is composed of inner lead portion 5a, outer lead portion 5b, and a platform portion 5c, wherein platform portion 5c is vertically distant from the inner lead portion 5a and outer lead portion 5b. Firstly, three chips are first stacked on inner lead 5a of lead-frame 5, and then metal wires 10, 11, and 12 are provided for connecting the pads 7, 8, and 9 on three chips to the platform portion 5c of lead-frame 5. The molding process is then performed for covering three stacked chips and inner lead 5a and part of platform portion 5c of lead-frame 5. The outer lead portion 5b is exposed to serve as leads connecting other interfaces.

In prior chip-stacked package structure as described above, the metal wires 10, 11, and 12 between each chip and the platform portion 5c of lead-frame 5 have different lengths and bending degrees. Therefore, in the molding process, not only metal wires of greater length and larger bending degree may shift and cause chips to become short but changes in the phase of electric signals would be also occurred.

SUMMARY OF THE INVENTION

In view of the drawbacks and problems of the prior chip-stacked package structure as mentioned above, the present invention provides a three-dimensional chip-stacked structure for packaging a plurality of chips with similar size.

It is an object of the present invention to provide a chip-stacked package structure with higher density of the integrated circuits and the thinner thickness in a package.

It is another object of the present invention to provide a stacked package structure for system chips with higher density of the integrated circuits and the thinner thickness in a package.

It is still another object of the present invention to provide a structure with high density of the integrated circuits and thinner thickness in a package in which stacking and packaging of pads on chips are formed by using redistribution layer.

According to abovementioned objects, the present invention provides a package structure with lead-frame on stacked chips, comprising: a lead-frame composed of a plurality of outer leads arranged in rows facing each other and a plurality of inner leads arranged in rows facing each other formed by a plurality of wires, wherein the plurality of inner leads are divided into first inner leads and second inner leads, and the length of the first inner leads is greater than that of the second inner leads; a chip-stacked structure stacked by a plurality of chips, the active surface of each chip facing upward and the chips being misaligned to form an offset stacked structure, wherein the chip stacked uppermost is fixedly connected under the first inner leads and the chip-stacked structure is electrically connected to the first inner leads and the second inner leads on the same side edge; and an encapsulant covering the stacked semiconductor chip devices and the lead-frame, the plurality of outer leads extending out of the encapsulant.

The present invention then provides a package structure with leadframe on stacked chips, comprising: a lead-frame composed of a plurality of outer leads arranged in rows facing each other and a plurality of inner leads arranged in rows facing each other formed by a plurality of wires, wherein the plurality of inner leads are divided into first inner leads and second inner leads, and the lower surface of first inner leads is provided with adhesive; a chip-stacked structure stacked by a plurality of chips, the back surface of each chip being provided with adhesive layer for adhering the pairs of chips to form offset stacked structure with active surface of chips facing upward, wherein the chip stacked uppermost is fixedly connected under the first inner leads and the chip-stacked structure is electrically connected to the first inner leads and the second inner leads on the same side edge; and an encapsulant covering the plurality of stacked semiconductor chip devices and the lead-frame, the plurality of outer leads extending out of the encapsulant.

The present invention further provides a package structure with lead-frame on stacked chips, comprising: a lead-frame composed of a plurality of outer leads arranged in rows facing each other and a plurality of inner leads arranged in rows facing each other formed by a plurality of wires, wherein the plurality of inner leads are divided into first inner leads and second inner leads, and the length of the first inner leads is greater than that of the second inner leads; a chip-stacked structure stacked by a plurality of chips, the active surface of each chip being provided with adhesive layer for adhering pairs of chips to form offset stacked structure with active surface of chips facing upward, wherein the chip stacked uppermost is fixedly connected under the first inner leads and the plurality of chips are electrically connected to the first inner leads and the second inner leads on the same side edge; and an encapsulant covering the plurality of stacked semiconductor chip devices and the lead-frame, the plurality of outer leads extending out of the encapsulant.

BRIEF DESCRIPTION OF THE DRAWINGS

FIGS. 2C to 2D are cross-sectional views schematically showing the offset chip-stacked structure according to the present invention.

FIGS. 3A to 3C are diagrams schematically showing the redistribution layer formed in a process according to the present invention.

FIGS. 4A to 4B are cross-sectional views schematically showing the bonding area on the redistribution layer according to the present invention.

FIGS. 7A to 7C are cross-sectional views schematically showing an offset chip-stacked package structure according to the present invention.

FIG. 8 is a cross-sectional view schematically showing an offset chip-stacked package structure according to another embodiment of the present invention.

DESCRIPTION OF THE PREFERRED EMBODIMENT

The present invention will now be described more fully hereinafter with reference to the accompanying drawings, in which the preferred embodiments are shown. In the following, the well-known knowledge regarding the chip-stacked structure of the invention such as the formation of chip and the process of thinning the chip would not be described in detail to prevent from arising unnecessary interpretations. However, this invention will be embodied in many different forms and should not be construed as limited to the embodiments set forth herein.

According to the semiconductor packaging process, a Front-End-Process experienced wafer is firstly performed a thinning process to reduce the thickness to a value between 2 mil and 20 mil, and then the polished wafer is applied with a polymer material such as a resin or a B-Stage resin by coating or printing. Next, a post-exposure baking or lighting process is applied to the polymer material so that the polymer material becomes a viscous semi-solidified gel-like material. Subsequently, a removable tape is attached to the viscous semi-solidified gel-like material and then the wafer is sawed into a plurality of chips or dies. At last, these chips or dies are stacked on and connected to a substrate to form a chip-stacked structure.

Figure 1B:
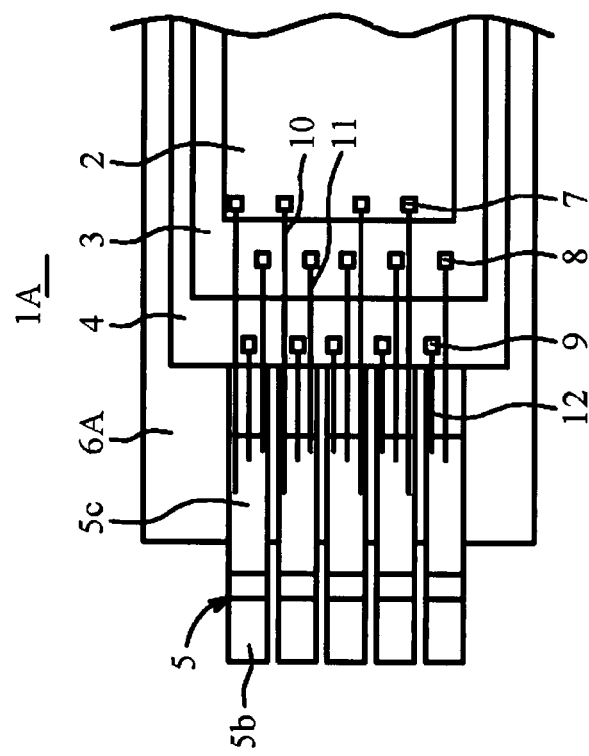
FIG. 1 is a diagram schematically showing a conventional chip-stacked package structure.
Figure 1A:
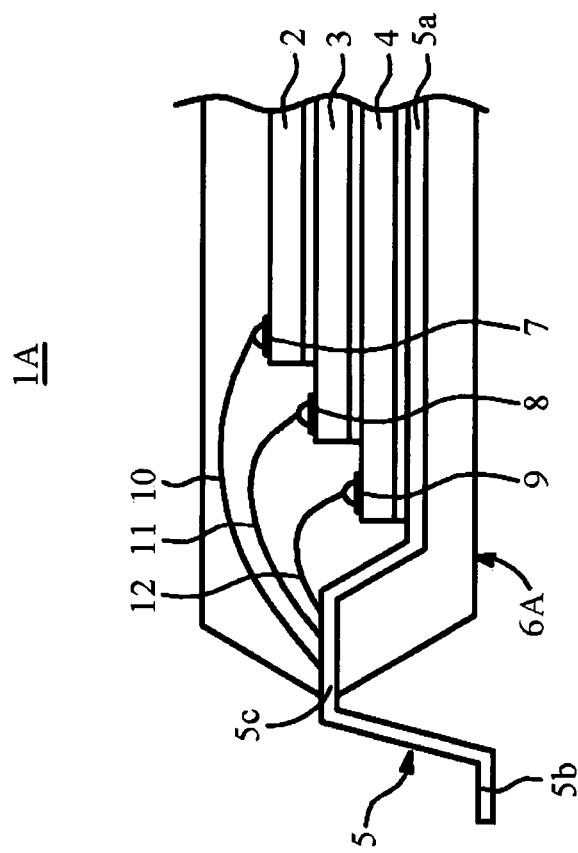
Figure 2B:
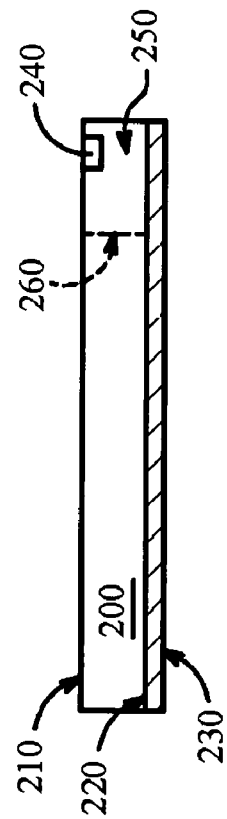
FIG. 2B is a cross-sectional view schematically showing the chip-stacked structure according to the present invention.
Figure 2A:
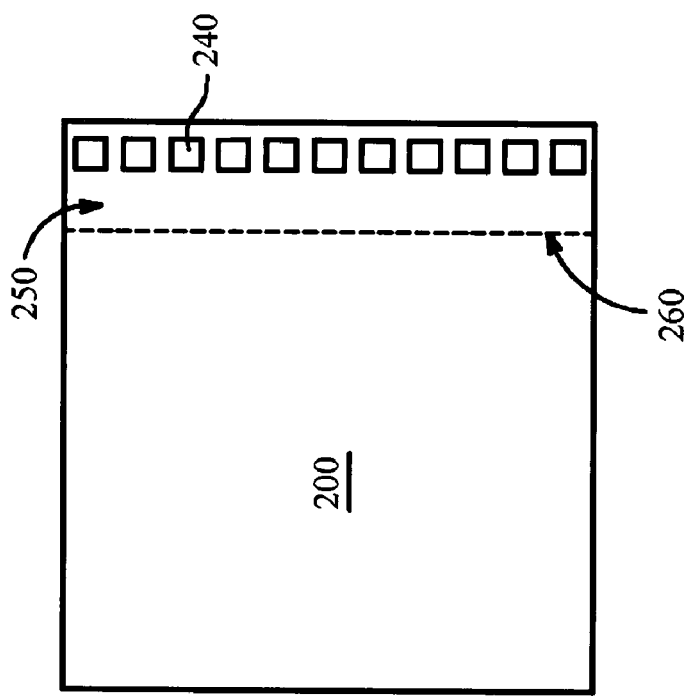
FIG. 2A is a top-elevational view schematically showing the chip-stacked structure according to the present invention.

Referring to FIGS. 2A and 2B, a chip 200 experiencing the above-mentioned processes has an active surface 210 and a back surface 220 in opposition to the active surface 210 with an adhesive layer 230 formed on the back surface 220. It is to be noted that the adhesive layer 230 is not limited to the above-mentioned semi-solidified gel-like material and can be any adhesive material, such as die-attached film, for joining the chip and a substrate together.

Then, referring to FIGS. 2C and 2D, show the cross-sectional views of a completed offset chip-stacked structure 30 according to the present invention. As shown in FIG. 2C, the active surface 210 of chip 200 is thereon provided with a plurality of pads 240 arranged along a side edge of chip 200. Accordingly, an offset chip-stacked structure 30 can be formed. The offset chip-stacked structure 30 is a ladder-like structure formed by aligning the side edge of upper chips with the edge line 260 of the bonding area 250 on lower chips. The edge line 260 herein is a presumed line for reference only but not a line exists on chip 200.

Moreover, the active surface 210 of chip 200 can also be coated with an adhesive layer in the offset chip-stacked structure 30 of the present invention. As shown in FIG. 2D, an adhesive layer 270 is coated on the active surface 210 of chip 200 and the bonding area 250 being exposed. An offset chip-stacked structure 30 can thus be formed by connecting the adhesive layer 270 on the active surface 210 of chip 200 and the back surface 220 of another chip. The offset chip-stacked structure 30 is a ladder-like structure formed by aligning the side edge of upper chips with the edge line 260 of the bonding area 250 on lower chips. It is to be noted that the adhesive layer 230 and the adhesive layer 270 are not limited to the above-mentioned semi-solidified gel-like material and can be any adhesive material, such as die-attached film, for joining the chip and the substrate together.

Another embodiment of the present invention, the process of making a chip with redistribution layer is disclosed. According to the present invention, a redistribution layer (RDL) is formed with pads provided along a side edge of the chip and the details are described as follows.

Referring to FIGS. 3A to 3C, which shows the chip structure with redistribution layer formed in a process according to the present invention. As shown in FIG. 3A, the chip 310 has first pads 312a and second pads 312b on the active surface and along side edges. The first pads 312a are located inside a bonding area 320, while the second pads 312b are pads located outside the bonding area 320. As shown in FIG. 3B, a first passivation layer 330 with a plurality of first openings 332 for exposing the first pads 312a and the second pads 312b is first formed on the chip 310, and a redistribution layer 340 with a plurality of conductive wires 342 and a plurality of third pads 344 is then formed on the first passivation layer 330. The third pads 344 are located inside the bonding area 320 and the conductive wires 342 electrically connect the second pads 312b and the third pads 344. The redistribution layer 340 is made up of conductive materials such as gold, copper, nickel, titanium tungsten, titanium or others. As shown in FIG. 3C, a whole chip structure 300 is completed by forming a second passivation layer 350 with a plurality of second openings 352 on the redistribution layer 340 to cover the area rather than the first pads 312a and the third pads 344 but expose the first pads 312a and the third pads 344.

It is to be noted that the first pads 312a and the second pads 312b can be arranged on surface of the chip 310 not only in the above-mentioned peripheral type but also in an area array type or other types rather than the above-mentioned types, provided that the second pads 312b are electrically connected with the third pads 344 via the conductive wires 342. Moreover, the third pads 344 can be arranged in a manner of being along side edge of the chip 310 and in parallel to the pads 312a such as shown in FIG. 3B or other manners such as in single row or two rows provided that the third pads 344 are located inside the bonding area 320.

Referring now to FIGS. 4A and 4B, show the cross-sectional views drawn along section lines A-A' and B-B' in FIG. 3C. According to FIG. 4A and FIG. 4B, the whole chip structure 300 is composed of the chip 310 and the redistribution layer 400. The redistribution layer 400 is composed of first passivation layer 330, redistribution layer 340, and second passivation layer 350. The presumed bonding area 320 of the chip 310 is a side edge adjacent to the chip 310. Moreover, the chip 310 has a plurality of first pads 312a and second pads 312b, wherein the first pads 312a are inside the bonding area 320 and the second pads 312b are outside the bonding area 320.

The first passivation layer 330 is disposed on the chip 310 that has a plurality of first openings 332 to expose the plurality of first pads 312a and the plurality of second pads 312b. The redistribution layer 340 with a plurality of third pads 344 is disposed on the first passivation layer 330 and extends from the second pads 312b to the bonding area 320, where the third pads 344 are located. The second passivation layer 350 covers the redistribution layer 340 and the first pads 312a and the third pads 344 are exposed through a plurality of second openings 352. Since the first pads 312a and third pads 344 are in the bonding area 320, the area rather than the bonding area 320 on the second passivation layer 350 is capable of carrying another chip structure and therefore accomplishing an offset chip-stacked structure 30.

Figure 5A:
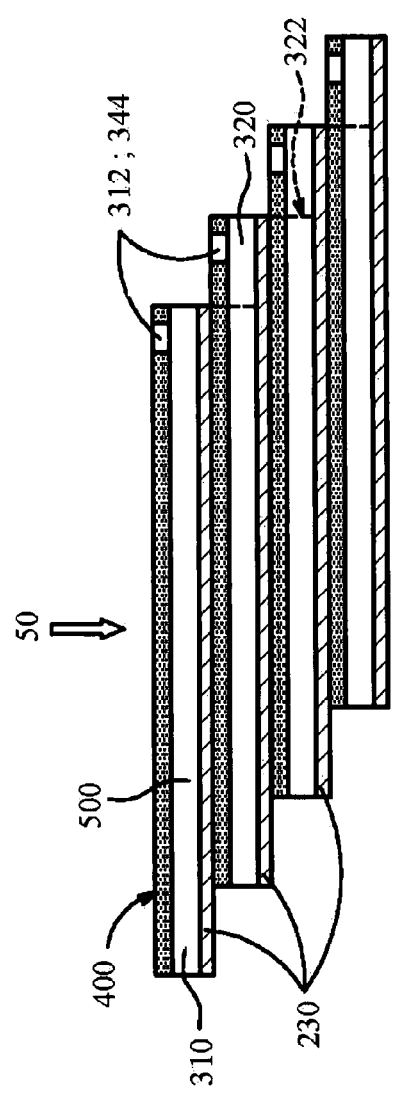
FIGS. 5A to 5B are cross-sectional views schematically showing an offset chip-stacked structure with redistribution layer according to the present invention.
Figure 5B:
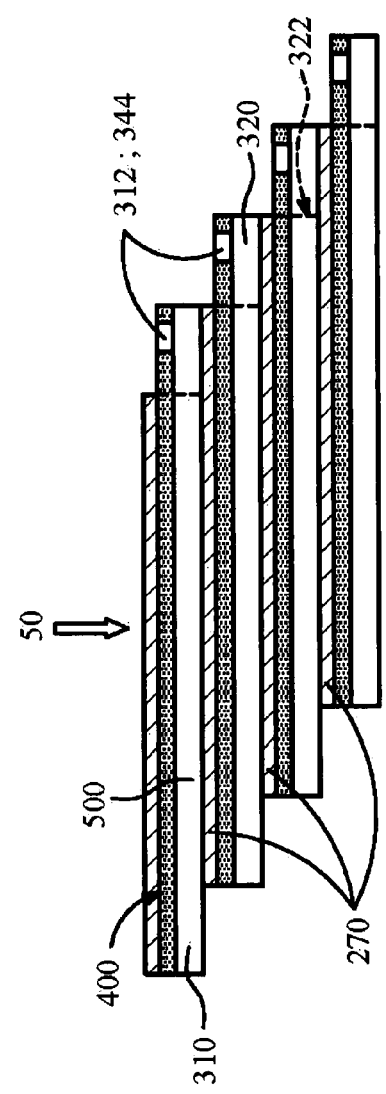

Referring to FIGS. 5A to 5B, show an offset chip-stacked structure 50 of the present invention. An offset chip-stacked structure 50 includes a plurality of stacked chips 500. Each of the chips 500 is formed with a redistribution layer 400 so that each of the chips 500 can be provided with pads inside the bonding area 320 on each chip. In this way, the offset chip-stacked structure 50 is formed by aligning the side edge of upper chips with a presumed edge line of the bonding area 320 on lower chips and an adhesive layer 230 formed by a polymer material is used to connect any two chips among the plurality of chips 500. First, referring to FIG. 5A, the adhesive layer 230 is provided on the back surface of chips 500. As what is shown in FIG. 2A, the adhesive layer 230 and the chip are formed simultaneously. The active surface of chips 500 is provided with redistribution layer 400 and thus pads on chips can be provided inside the bonding area 320 of chips 500. An offset chip-stacked structure 50 can thus be formed after the offset connection of adhesive layer 230 on the back surface of one chip 500 and the distribution layer 400 of another chip 500 is performed. The offset chip-stacked structure 50 is a ladder-like structure formed by aligning the side edge of upper chips with the edge line 322 of the bonding area 320 on lower chips, as shown in FIG. 5A.

Moreover, the redistribution layer 400 of the chips 500 can also be coated with an adhesive layer in the offset chip-stacked structure 50 of the present invention. As shown in FIG. 5B, an adhesive layer 270 is coated on the redistribution layer 400 of the chips 500 and the bonding area 320 is exposed. An offset chip-stacked structure 50 can thus be formed after the adhesive layer 230 is on the redistribution layer 400 of one chip 500 and the back surface of another chip 500 is performed. The offset chip-stacked structure 50 is a ladder-like structure that is formed by aligning the side edge of upper chips with the edge line 322 of the bonding area 320 on lower chips. It is to be noted that the adhesive layer 270 is not limited to the above-mentioned semi-solidified gel-like material and can be any adhesive material, such as die-attached film, for joining the chip and the substrate together.

In the following, a chip-stacked package structure of the present invention will be disclosed, in which the above-mentioned offset chip-stacked structure 50 will be taken as an example for illustration. However, the following descriptions can also be applied to the above-mentioned offset chip-stacked structure 30.

Figure 6:
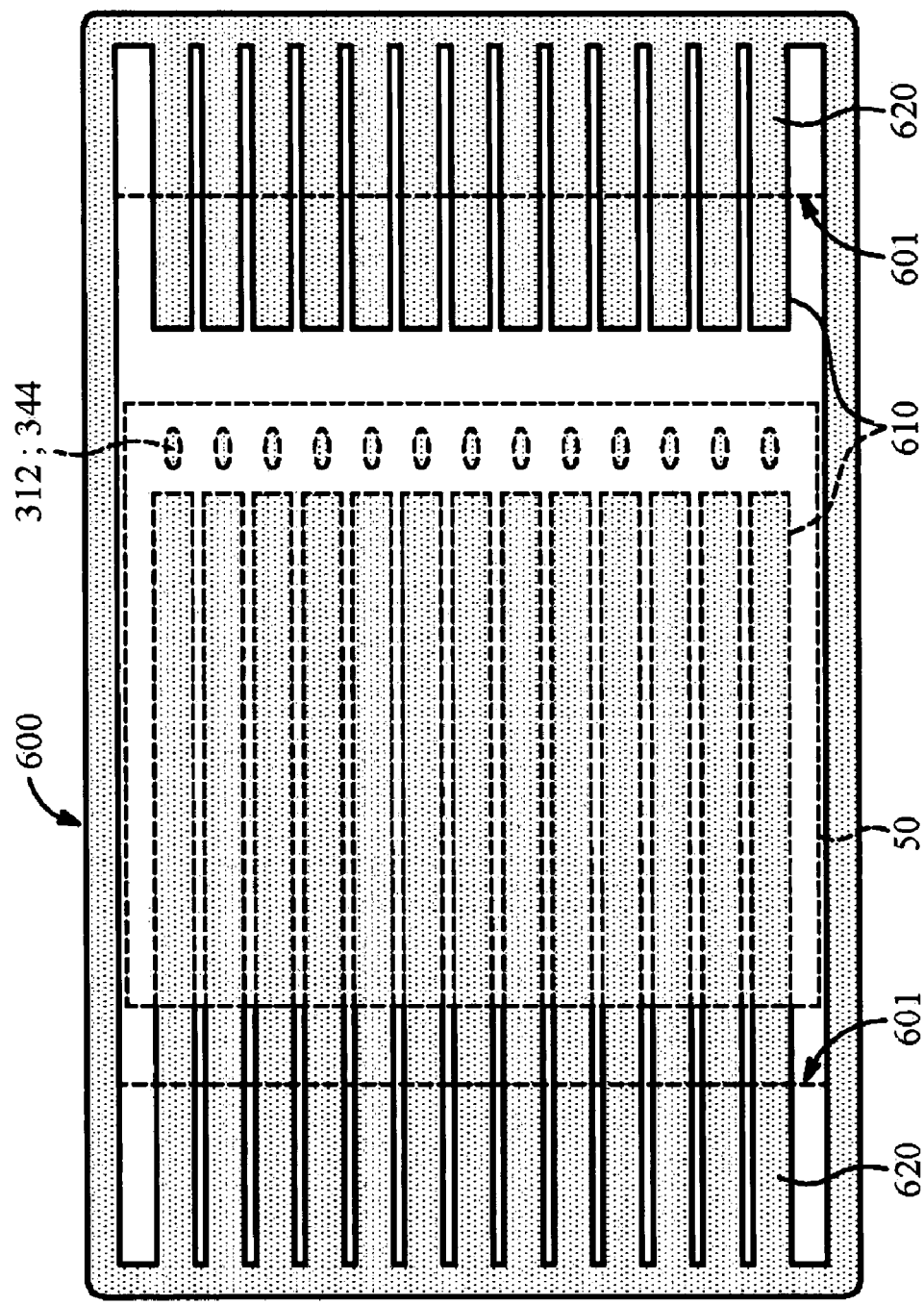
FIG. 6 is a top-elevational view schematically showing an offset chip-stacked package structure according to the present invention.

First referring to FIG. 6, which is a plane view of lead-frame of chip-stacked package structure according to the present invention. As shown in FIG. 6, the chip-stacked package structure comprises lead-frame 600 and offset chip-stacked structure 50, wherein the lead-frame 600 is composed of a plurality of inner leads 610 that arranged in rows facing each other and the plurality of outer leads 620, and the plurality of inner leads on one opposite side (called for short "first inner leads") are longer than the plurality of inner leads on another opposite side (called for short "second inner leads"). In the present embodiment, the chip-stacked structure 50 is provided on the first inner leads 610 and is connected to the inner leads 610 of lead-frame 600 with the metal wires 640. Moreover, the dotted line 601 in FIG. 6 is only for marking the area of inner leads 610 and outer leads 620 but not exists on the lead-frame 600.

Then, referring to FIGS. 7A to 7C, which are cross-sectional views of offset chip-stacked package structure of the present invention. First, as shown in FIG. 7A, an adhesive layer 270 is provided for connecting the inner leads 610 of lead-frame 600 and the offset chip-stacked structure 50. The adhesive layer 270 can be provided on the inner leads 610 of lead-frame 600 and connected to the offset chip-stacked structure 50; the adhesive layer 270 can also be provided on the redistribution layer 400 of the uppermost chip 500 in FIG. 7A for connecting the inner leads 610 of lead-frame 600 and the chip-stacked structure 50. Apparently, the chip-stacked structure 50 as shown in FIG. 7B, the adhesive layer 270 is coated on the redistribution layer 400 of chip 500 and the bonding area 320 is exposed for directly connecting the chip-stacked structure 50 and the inner leads 610 of lead-frame 600.

Moreover, in the present embodiment, the connection between inner leads 610 of lead-frame 600 and offset chip-stacked structure 50 can also be accomplished by using a tape 520 as an adhesive material, and more particularly, the tape 520 that is adhesive on both sides. The tape 520 can be an integral structure and can also be a plurality of fragments, as shown in FIG. 7C. The tape 520 is first adhered to the back surface (i.e. the surface that connecting the active surface or redistribution layer of chip) of inner leads 610 of lead-frame 600 and then adhered to the active surface or redistribution layer of chip. The connection of lead-frame 600 and the offset chip-stacked structure 50 is thus accomplished. The tape 520 can also be first adhered to the active surface or redistribution layer 400 of chip and then adhered to the inner leads 610 of lead-frame 600. The same purpose can also be achieved and the order of connection is not limited in the present invention.

The connection of metal wires is then performed after the connection of lead-frame 600 and offset chip-stacked structure 50 is made. As shown in FIG. 7A, a plurality of wires 640 are connected to the lead-frame 600 and offset chip-stacked structure 50, wherein lead-frame 600 is composed of a plurality of inner leads 610 arranged in rows facing each other and outer leads 620. The metal wire 640a has its one end connected to a pad of chip 500a, the first pad 312a or the third pad 344 as described in FIG. 3 for example, and has the other end that connected to the first pad 312a or the third pad 344 of the chip 500b in a wire-bonding process. Similarly, the metal wire 640b has one end that connected to the first pad 312a or the third pad 344 of the chip 500b and has the other end that connected to the first pad 312a or the third pad 344 of the chip 500c in a wire-bonding process. The metal wire 640c has one end that connected to the first pad 312a or the third pad 344 of the chip 500c and has the other end that connected to the first pad 312a or the third pad 344 of the chip 500d in a wire-bonding process. The chip 500d and the plurality of inner leads 610 of lead-frame 600 are electrically connected with the metal wires 640d and 640e in a wire-bonding process. In this way, the chips 500a, 500b, 500c and 500d are electrically connected to the lead-frame 600 when the wire-bonding processes of the metal wires 640a, 640b, 640c, 640d, and 640e are completed. These metal wires 640 can be gold made wires. Finally, an encapsulant (not shown) is provided for covering the offset chip-stacked structure 50 and the inner leads 610 of lead-frame 600 in the electrically connected offset chip-stacked package structure, and the outer leads of lead-frame 600 extend out of the encapsulant (not shown) to form the chip-stacked package structure.

In addition to the above-mentioned process, the connection between lead-frame 600 and offset chip-stacked structure 50 with metal wires can also be accomplished by first processing the wire-bonding processes of chips 500a, 500b, 500c, and 500d after the structure of offset chip-stacked structure 50 is completed. The connecting processes are the same as the above-mentioned processes. After the offset chip-stacked structure 50 that has experienced electrical connection and the lead-frame 600 are attached to each other, the wire-bonding process is performed again to connect the offset chip-stacked structure 50 and the inner leads 610 of lead-frame 600. Thus, the structure in FIG. 7 can be finished.

Then referring to FIG. 8, shows the wire bonding process of lead-frame 600 and offset chip-stacked structure 50 in another embodiment of the present invention. As shown in FIG. 8, in the present embodiment, after the lead-frame 600 and the offset chip-stacked structure 50 are fixedly connected and before the wire bonding process of metal wires 640 is started, a stud bump 650 is first formed on first pad 312a and third pad 344 in bonding area 320 of chip 500. The connection of above-mentioned metal wires 640a, 640b, 640c, 640d, and 640e are electrically connected the chips 500a, 500b, 500c, and 500d to the lead-frame 600. This stud bump 650 is provided as a spacer in order to decrease the bending degree of metal wires 640a, 640b, 640c, 640d, and 640e. It is to be noted that the process of forming the stud bump 650 and the process of forming metal wires 640 can be performed simultaneously. In other words, the stud bump 650 and the metal wires 640 can be formed by using the same apparatus. Therefore, the disposition of stud bump 650 in addition does not make the process more difficult or complicate.

As described in the above embodiments, the number of the chips of the chip-stacked structure 50 is not so limited, and any person skilled in the art could manufacture a chip-stacked structure including at least three chips according to the above-disclosed method. Meanwhile, the offset chip-stacked structure 50 in the embodiment in FIG. 7 can also be replaced by offset chip-stacked structure 30. Since the wire-bonding process of the offset chip-stacked structure 30 performed after the connection to lead-frame 600 and the wire-bonding process of the offset chip-stacked structure 50 performed after the connection to lead-frame 600 disclosed above are the same, the process would not be given unnecessary details herein.

In summary, in addition to the method of providing a plurality of pads on one side edge of chip in the Front End Process in the chip structure, the present invention also discloses another method of arranging the bonding area and the redistribution layer properly and providing first pads and third pads on one side edge of chip structure so that area other than the bonding area on the chip structure can directly carry other chip structures. Thus, when the chip-stacked package structure formed according to the above-mentioned stacking method and prior chip-stacked package structure are compared, the scale of the integrated circuits is increased and the thickness in a package is reduced.

While the invention has been described by way of examples and in terms of the preferred embodiments, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A package structure with leadframe on chip-stacked structure, comprising:
    a lead-frame, composed of a plurality of outer leads arranged in rows facing each other and a plurality of inner leads arranged in rows facing each other formed by a plurality of wires, wherein said plurality of inner leads are divided into a plurality of first inner leads and a plurality of second inner leads, and the length of said plurality of first inner leads is greater than that of said plurality of second inner leads;
    a chip-stacked structure stacked by a plurality of chips, an active surface of each said chip facing upward and each said chip being misaligned to form an offset stacked structure, wherein said chip stacked uppermost in said chip-stacked structure that is fixedly connected under said plurality of first inner leads, and said chip-stacked structure is electrically connected to said plurality of first inner leads and said plurality of second inner leads on the same side edge; and
    an encapsulant covering said chip-stacked structure and said lead-frame, said plurality of outer leads extending out of said encapsulant.

2. The package structure as set forth in claim 1, wherein same side edge of each said chip stacked uppermost in said chip-stacked structure is directly electrically connected with said plurality of first inner leads and said plurality of second inner leads.

3. The package structure as set forth in claim 1, wherein each said chip stacked in pairs in said chip-stacked structure that are electrically connected to each other on the same side edge.

4. The package structure as set forth in claim 1, wherein the pads on each said chip in said chip-stacked structure are provided on same side edge by using a redistribution layer.

5. The package structure as set forth in claim 1, wherein each chip in said chip-stacked structure comprises:
    said chip with a bonding area, said bonding area being provided on one side edge of said chip, said chip being provided with a plurality of first pads located inside said bonding area and a plurality of second pads located outside said bonding area;
    a first passivation layer provided on said chip, wherein said first passivation layer is provided with a plurality of first openings for exposing said plurality of first pads and said plurality of second pads;
    a redistribution layer provided on said first passivation layer for connecting said plurality of second pads and said bonding area, said redistribution layer being provided with a plurality of third pads located inside said bonding area; and
    a second passivation layer covering said redistribution layer, wherein said second passivation layer is provided with a plurality of second openings for exposing said plurality of first pads and said plurality of third pads.

6. The package structure as set forth in claim 1, wherein the lower surface of said plurality of first inner leads is provided with an adhesive for fixedly connecting said chip stacked uppermost in said chip-stacked structure under said plurality of first inner leads.

7. The package structure as set forth in claim 1, wherein the back surface of each said chip is provided with an adhesive for adhering the pair of said chips to form an offset stacked structure with an active surface of said chips facing upward.

8. The package structure as set forth in claim 1, wherein said active surface of each said chip is provided with an adhesive for adhering a pair of chips to form an offset stacked structure with said active surface of chips facing upward and said chips stacked uppermost fixedly connected under said plurality of first inner leads.

9. A package structure with leadframe on chip-stacked structure, comprising:
    a leadframe, composed of a plurality of outer leads and a plurality of inner leads formed by a plurality of wires, wherein said plurality of inner leads are divided into a plurality of first inner leads and a plurality of second inner leads and the length of said plurality of first inner leads is greater than that of said plurality of second inner leads, lower surface of said plurality of first inner leads being provided with an adhesive;

a chip-stacked structure stacked by a plurality of chips, a back surface of each said chip being provided with an adhesive for adhering said plurality of chips in pairs to form an offset stacked structure with an active surface of said chips facing upward, wherein said plurality connected under said plurality of first inner leads and said chip-stacked structure is electrically connected with said plurality of first inner leads and said plurality of second inner leads on same side edge; and an encapsulant covering said chip-stacked structure and said lead-frame, said plurality of outer leads extending out of said encapsulant.

10. The package structure as set forth in claim 9, wherein same side edge of each chip stacked uppermost in said chip-stacked structure is directly electrically connected with said plurality of first inner leads and said plurality of second inner leads.

11. The package structure as set forth in claim 9, wherein each said chip in pairs in said chip-stacked structure that are electrically connected to each other on the same side edge.

12. The package structure as set forth in claim 9, wherein the pads on each said chip in said chip-stacked structure are provided on same side edge by using a redistribution layer.

13. The package structure as set forth in claim 9, wherein each said chip in said chip-stacked structure comprises:

said chip with a bonding area, said bonding area being provided on one side edge of said chip, said chip being provided with a plurality of first pads located inside said bonding area and a plurality of second pads located outside said bonding area;

a first passivation layer provided on said chip, wherein said first passivation layer is provided with a plurality of first openings for exposing said plurality of first pads and said plurality of second pads;

a redistribution layer provided on said first passivation layer for connecting said plurality of second pads and said bonding area, said redistribution layer being provided with a plurality of third pads located inside said bonding area; and a second passivation layer covering said redistribution layer, wherein said second passivation layer is provided with a plurality of second openings for exposing said plurality of first pads and said plurality of third pads.

14. The package structure as set forth in claim 9, wherein said plurality of first pads and said plurality of third pads are further provided with a stud bump structure.

15. A package structure with leadframe on chip-stacked structure, comprising:

a lead-frame, composed of a plurality of outer leads and a plurality of inner leads formed by a plurality of wires, wherein said plurality of inner leads are divided into a plurality of first inner leads and a plurality of second inner leads and the length of said plurality of first inner leads is greater than that of said plurality of second inner leads;

a chip-stacked structure stacked by a plurality of chips, an active surface of each said chip being provided with an adhesive for adhering said plurality of chips in pairs to form an offset stacked structure with said active surface of said plurality of chips facing upward, wherein said plurality of chip stacked uppermost in said chip-stacked structure is fixedly connected under said plurality of first inner leads and said plurality of chips is electrically connected with said plurality of first inner leads and said plurality of second inner leads on same side edge; and an encapsulant covering said chip-stacked structure and said lead-frame, said plurality of outer leads extending out of said encapsulant.

16. The package structure as set forth in claim 15, wherein same side edge of each said chip stacked uppermost in said chip-stacked structure is directly electrically connected with said plurality of first inner leads and said plurality of second inner leads.

17. The package structure as set forth in claim 15, wherein each said chip in pairs in said chip-stacked structure that are electrically connected to each other on the same side edge.

18. The package structure as set forth in claim 15, wherein the pads on each said chip in said chip-stacked structure are provided on same side edge by using a redistribution layer.

19. The package structure as set forth in claim 15, wherein each said chip in said chip-stacked structure comprises:

said chip with a bonding area, said bonding area being provided on one side edge of said chip, said chip being provided with a plurality of first pads located inside said bonding area and a plurality of second pads located outside said bonding area;

a first passivation layer provided on said chip, wherein said first passivation layer is provided with a plurality of first openings for exposing said plurality of first pads and said plurality of second pads;

a redistribution layer provided on said first passivation layer for connecting said plurality of second pads and said bonding area, said redistribution layer being provided with a plurality of third pads located inside said bonding area; and a second passivation layer covering said redistribution layer, wherein said second passivation layer is provided with a plurality of second openings for exposing said plurality of first pads and said plurality of third pads.

20. The package structure as set forth in claim 15, wherein said plurality of first pads and said plurality of third pads are further provided a stud bump structure.

* * * * *